(12) United States Patent
Jeong

(10) Patent No.: US 8,409,770 B2
(45) Date of Patent: Apr. 2, 2013

(54) BLANK MASK AND METHOD OF FABRICATING MASK USING THE SAME

(75) Inventor: Soo Kyeong Jeong, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 208 days.

(21) Appl. No.: 12/980,484

(22) Filed: Dec. 29, 2010

(65) Prior Publication Data

US 2011/0159416 A1     Jun. 30, 2011

(30) Foreign Application Priority Data

Dec. 30, 2009   (KR) ................. 10-2009-0134651

(51) Int. Cl.
    *G03F 1/22*        (2012.01)
    *G03F 1/24*        (2012.01)
    *G03F 1/48*        (2012.01)

(52) U.S. Cl. ............................................... 430/4; 430/5
(58) Field of Classification Search ................ 430/4–5
See application file for complete search history.

(56) References Cited

U.S. PATENT DOCUMENTS

| | | | |
|---|---|---|---|
| 6,297,169 B1 * | 10/2001 | Mangat et al. | ............ 430/5 |
| 6,882,406 B2 | 4/2005 | Kurt et al. | |
| 2005/0157283 A1 | 7/2005 | Kurt et al. | |

* cited by examiner

*Primary Examiner* — Mark F Huff
*Assistant Examiner* — John S Ruggles
(74) *Attorney, Agent, or Firm* — William Park & Associates Ltd.

(57) ABSTRACT

A blank mask includes a substrate, a multilayer reflection layer disposed over the substrate, a capping layer disposed over the multilayer reflection layer, a self-assembled monolayer disposed over the capping layer, a buffer layer disposed over the self-assembled monolayer, and an absorption layer disposed over the buffer layer.

12 Claims, 5 Drawing Sheets

BLANK MASK AND METHOD OF FABRICATING MASK USING THE SAME

CROSS-REFERENCES TO RELATED APPLICATIONS

The present application claims priority under 35 U.S.C 119(a) to Korean application number 10-2009-0134651, filed on Dec. 30, 2009, in the Korean intellectual property Office, which is incorporated herein by reference in its entirety set forth in full.

BACKGROUND

Exemplary embodiments of the present invention relate to a photomask for use in a semiconductor fabrication, and more particularly, to an extreme ultraviolet (EUV) blank mask applicable to extreme ultraviolet lithography (EUVL) and a method of fabricating an EUV mask using the same.

As an integration density of semiconductor devices is increasing in recent years, optical lithography may have a limitation. Small images may be transferred on a wafer by using resolution enhancement technologies, such as an optical proximity correction (OPC), a phase shift mask, an off-axis illumination, and so on. However, as a design rule of semiconductor devices decreases, these technologies may have the limitation. Accordingly, a lithography which can transfer smaller images on a wafer is being developed. An immersion lithography which increases a resolution by using a liquid medium having a higher refractive index than air has recently been proposed. In addition, much research is being conducted on next generation lithography technologies which can ensure finer resolutions.

Examples of next generation lithography technologies include an extreme ultraviolet lithography (EUVL), an electron projection lithography (EPL), a proximity electron-beam lithography (PEL), a proximity X-ray lithography (PXL), and so on. Here, the EUVL is designed to use a wavelength of approximately 13.5 nm. However, a light having the wavelength of approximately 13.5 nm is absorbed by most materials, including air. Thus, the EUVL may use reflective masks and reflective optical systems, instead of transmissive masks and transmissive optical systems.

FIG. 1 is a cross-sectional view schematically illustrating a sectional structure of an blank mask 100 used in a known lithography technology. Referring to FIG. 1, a multilayer reflection layer 120 is disposed over a substrate 110. Although not shown, a backside layer may be disposed under the substrate 110. The multilayer reflection layer 120 may be formed by sequentially stacking materials 121 and 122 having different optical properties. As one example, the multilayer reflection layer 120 may have a structure in which molybdenum (Mo) 121 and silicon (Si) 122 are alternately stacked. A capping layer 130 serving to protect the multilayer reflection layer 120 is disposed over the multilayer reflection layer 120. As one example, the capping layer 130 may include a silicon oxide ($SiO_2$) layer or a silicon (Si) layer. A buffer layer 140 and an absorption layer 150 are sequentially stacked over the capping layer 130. As one example, the buffer layer 140 may include a silicon oxide ($SiO_2$) layer, and the absorption layer 150 may include a tantalum (Ta)-based absorber, such as a tantalum nitride (TaN) layer, or a chromium (Cr)-based absorber.

FIG. 2 is a cross-sectional view schematically illustrating a sectional structure of an mask 102 formed by using the blank mask 100 of FIG. 1. In FIGS. 1 and 2, the same reference numerals refer to the same elements. Referring to FIG. 2, a pattern structure in which a buffer pattern 142 and an absorption pattern 152 are sequentially stacked is disposed over the capping layer 130. In order to fabricate such an mask 102, according to a known art, the absorption pattern 152 and the buffer pattern 142 are formed by patterning the absorption layer (150 in FIG. 1) and the buffer layer (140 in FIG. 1) of the blank mask 100.

However, when the patterning process is performed, specifically, when the patterning process is performed by etching the buffer layer (140 in FIG. 1), the capping layer 130 may be damaged because both of the capping layer 130 and the buffer layer (140 in FIG. 1) are formed of a silicon-based material. The damage of the capping layer 130 may cause defects in the multilayer reflection layer 120. The defects in the multilayer reflection layer 120 may cause a change in the intensity of reflected light. This may serve as a cause of device failure.

SUMMARY

An embodiment of the present invention relates to an blank mask which is capable of substantially preventing a capping layer from being damaged by an etching process for patterning a buffer layer disposed over the capping layer.

In an exemplary embodiment, a blank mask includes a substrate, a multilayer reflection layer disposed over the substrate, a capping layer disposed over the multilayer reflection layer, a self-assembled monolayer disposed over the capping layer, a buffer layer disposed over the self-assembled monolayer, and an absorption layer disposed over the buffer layer.

In another exemplary embodiment, an EUV blank mask includes a substrate, a multilayer reflection layer disposed over the substrate, a capping layer disposed over the multilayer reflection layer, a buffer layer disposed over the capping layer and composed of a self-assembled monolayer, and an absorption layer disposed over the self-assembled monolayer.

In another exemplary embodiment, a method of fabricating a mask includes preparing a blank mask including a substrate, a multilayer reflection layer disposed over the substrate, a capping layer disposed over the multilayer reflection layer, a self-assembled monolayer disposed over the capping layer, a buffer layer disposed over the self-assembled monolayer, and an absorption layer disposed over the buffer layer, forming an absorption pattern and a buffer pattern by etching the absorption layer and the buffer layer using the self-assembled monolayer as an etching stop layer, and removing the self-assembled monolayer exposed by the absorption pattern and the buffer pattern.

In another exemplary embodiment, a method of fabricating a mask includes preparing a blank mask including a substrate, a multilayer reflection layer disposed over the substrate, a capping layer disposed over the multilayer reflection layer, a buffer layer disposed over the capping layer and composed of a self-assembled monolayer, and an absorption layer disposed over the self-assembled monolayer, partially exposing the surface of the buffer layer by etching a portion of the absorption layer, and removing an exposed portion of the buffer layer by irradiating ultraviolet light onto the exposed portion of the buffer layer.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, specific exemplary embodiments of the present invention will be described with reference to the accompanying drawings. The drawings are not necessarily to scale and in some instances, proportions may have been exaggerated in order to clearly depict certain features of the invention.

Figure 1:
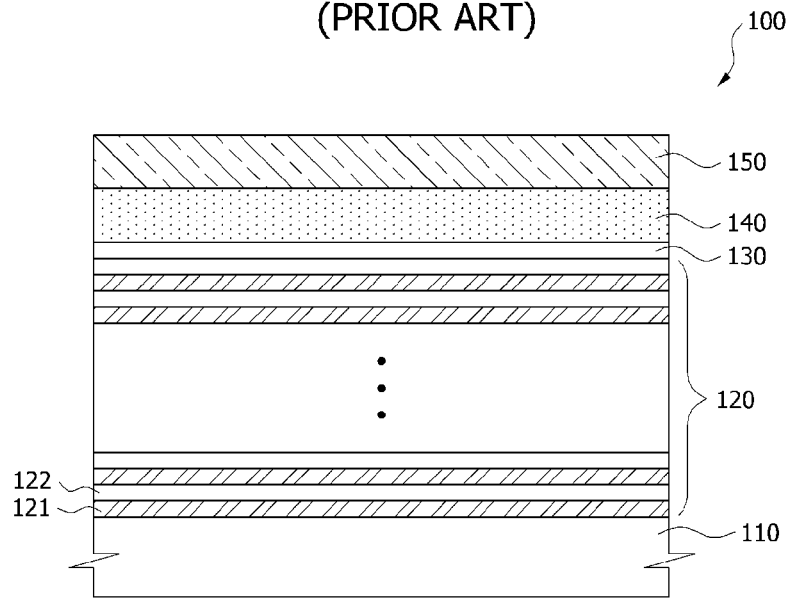
FIG. 1 is a cross-sectional view schematically illustrating a sectional structure of an blank mask used in a known lithography process.
Figure 2:
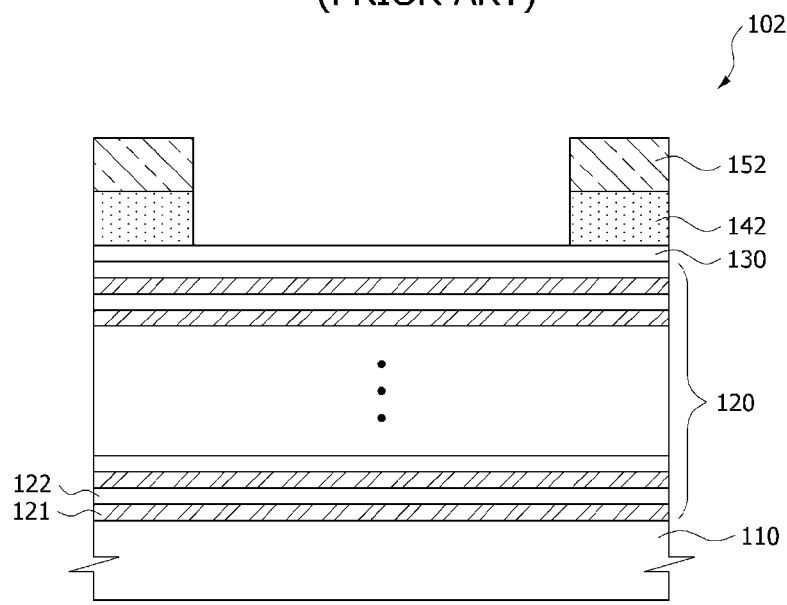
FIG. 2 is a cross-sectional view schematically illustrating a sectional structure of an mask formed by using the blank mask of FIG. 1.
Figure 3:
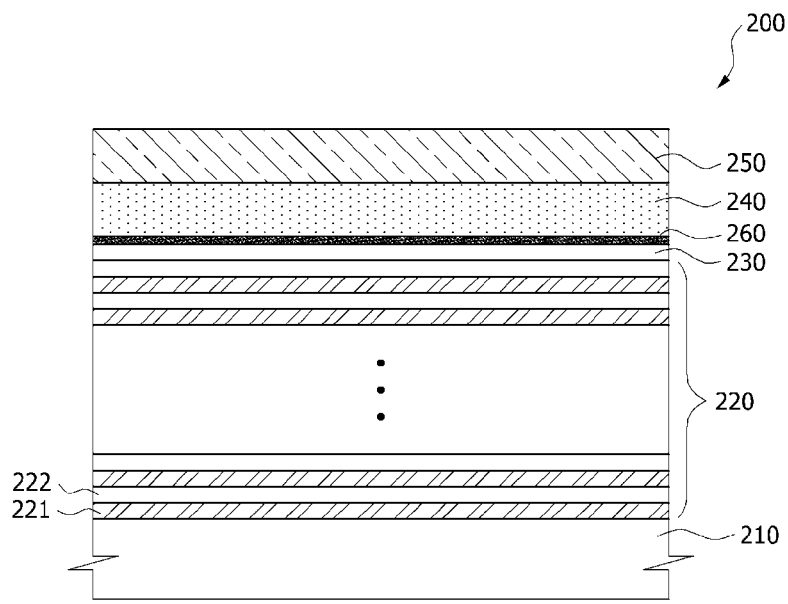
FIG. 3 is a cross-sectional view illustrating an blank mask according to an exemplary embodiment of the present invention.

FIG. 3 is a cross-sectional view illustrating an blank mask 200 according to an exemplary embodiment of the present invention. Referring to FIG. 3, a multilayer reflection layer 220 is disposed over a substrate 210. Although not shown, a backside layer may be disposed under the substrate 210. The multilayer reflection layer 220 is formed by sequentially stacking materials 221 and 222 having different optical properties. Here, a constructive interference (Bragg reflection) of a partial reflection which occurs at the interface of the materials 221 and 222 may be used. The reflectivity of the multilayer reflection layer 220 is proportional to the square of the difference between the refractive indexes (real parts of complex refractive indexes) of the two materials 221 and 222 which are alternately stacked. In addition, the wavelength and maximum reflectivity of the reflected light, for example, an extreme ultraviolet (UV) are determined based upon the kinds of the materials 221 and 222. For example, if the multilayer reflection layer 220 has a structure in which molybdenum (Mo) 221 and silicon (Si) 222 are alternately stacked, its maximum reflectivity ranges from approximately 60% to approximately 75%. A capping layer 230 serving to protect the multilayer reflection layer 220 is disposed over the multilayer reflection layer 220. As one example, the capping layer 230 may include a silicon oxide ($SiO_2$) layer or a silicon (Si) layer.

A self-assembled monolayer 260 is disposed over the capping layer 230. The self-assembled monolayer 260 serves as an etching stop layer for an etching gas with respect to a silicon-containing material. The self-assembled monolayer 260 may include a silane-based material having at least one carbon-silicon bond structure, as exemplarily shown in the following chemical formula 1.

[Chemical Formula 1]

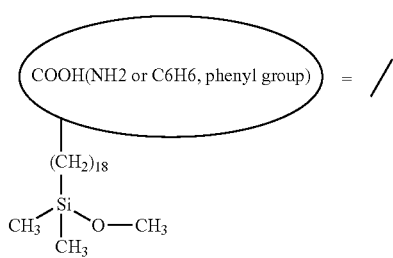

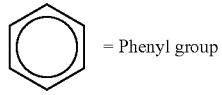= Phenyl group

A buffer layer 240 and an absorption layer 250 are sequentially stacked over the self-assembled monolayer 260. As one example, the buffer layer 240 may include a silicon oxide ($SiO_2$) layer, and the absorption layer 250 may include a tantalum (Ta)-based absorber, such as a tantalum nitride (TaN) layer, or a chromium (Cr)-based absorber. Since the self-assembled monolayer 260 is disposed between the capping layer 230 and the buffer layer 240, the self-assembled monolayer 260 serves as an etching stop layer during the etching process for patterning the buffer layer 240. Accordingly, a damage of the capping layer 230, during the etching process of the buffer layer 240, may decrease.

Figure 4:
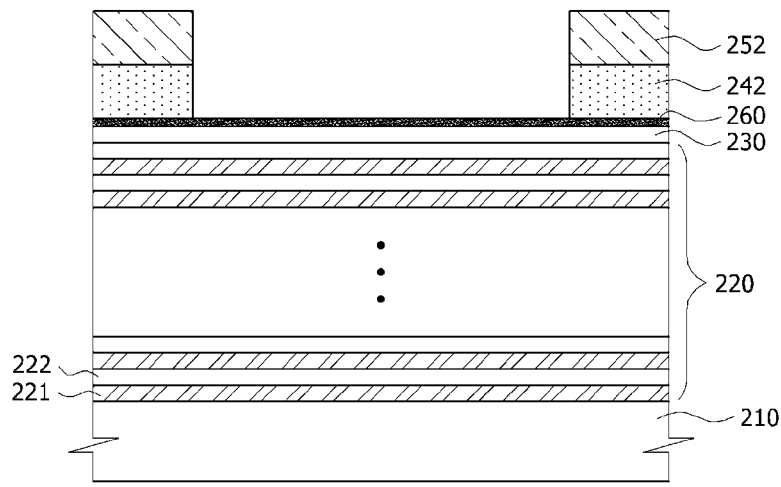
FIGS. 4 to 6 are cross-sectional views explaining a method of fabricating a mask using the blank mask of FIG. 3.
Figure 5:
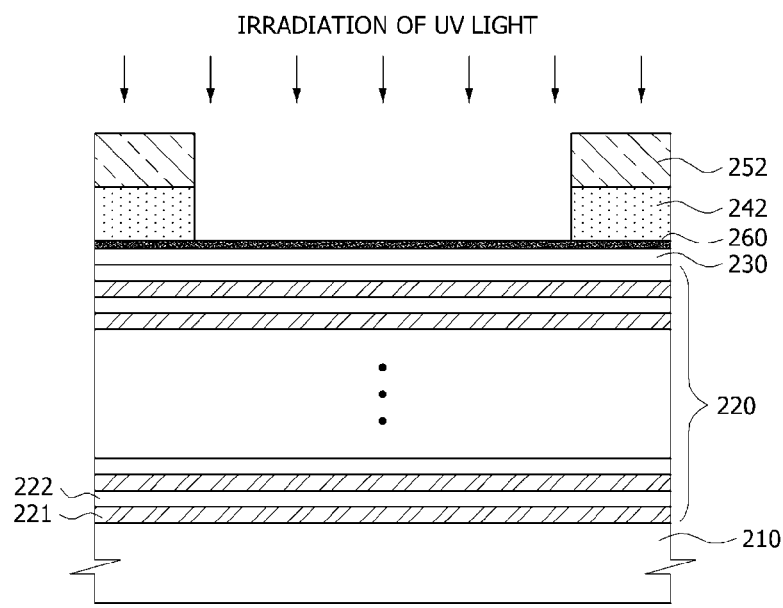
Figure 6:
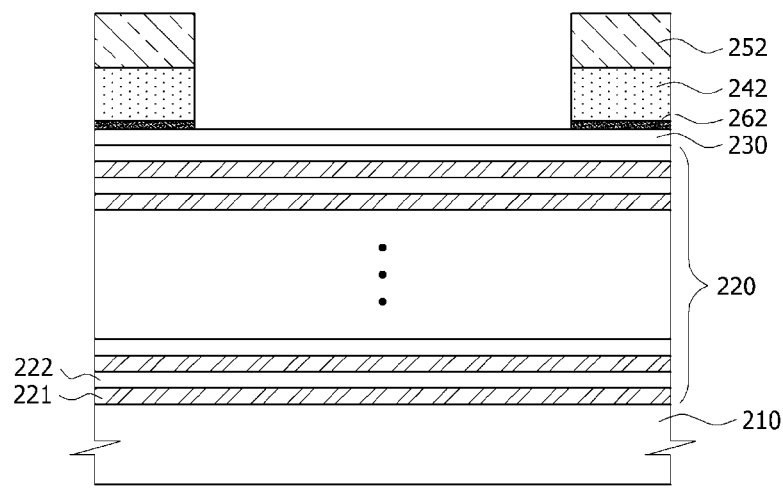

FIGS. 4 to 6 are cross-sectional views explaining a method of fabricating an mask using the blank mask of FIG. 3. As illustrated in FIG. 4, an absorption pattern 252 and a buffer pattern 242 are formed by patterning the absorption layer 250 and the buffer layer 240. The patterning may be performed by forming an etching mask (not shown) and performing an etching process using the etching mask. The self-assembled monolayer 260 serves as an etching stop layer during the etching process. The etching process for forming the buffer pattern 242 is performed until the self-assembled monolayer 260 is exposed. Consequently, the capping layer 230 disposed under the self-assembled monolayer 260 can be safely protected, without being practically affected by the etching.

As indicated by arrows in FIG. 5, a light is irradiated onto the self-assembled monolayer 260 exposed by the absorption pattern 252 and the buffer pattern 242. Here, the light includes an untraviolet, for example, extreme ultraviolet. The self-assembled monolayer 260 onto which the light is irradiated is removed. Consequently, as illustrated in FIG. 6, a self-assembled monolayer pattern 262 exposing the capping layer 230 is formed.

Figure 7:
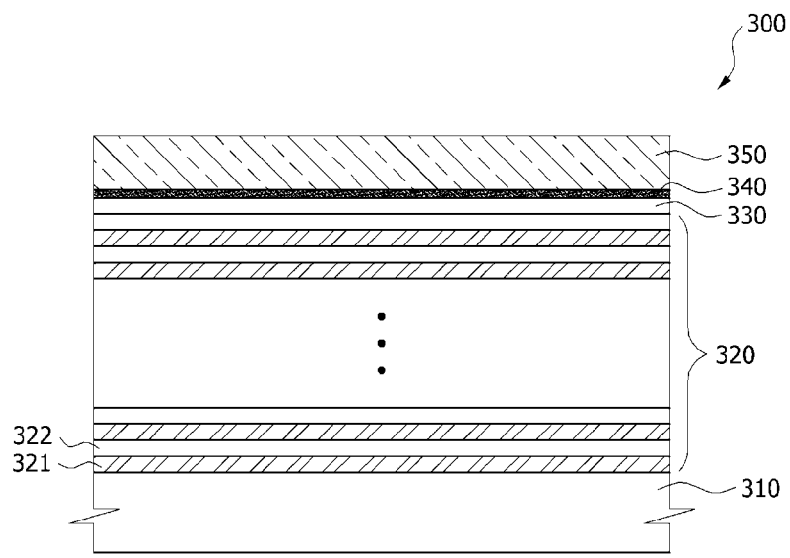
FIG. 7 is a cross-sectional view illustrating a blank mask 300 according to another exemplary embodiment of the present invention.

FIG. 7 is a cross-sectional view illustrating an blank mask 300 according to another exemplary embodiment of the present invention. Referring to FIG. 7, a multilayer reflection layer 320 is disposed over a substrate 310. Although not shown, a backside layer may be disposed under the substrate 310. The multilayer reflection layer 320 is formed by sequentially stacking materials 321 and 322 having different optical properties. Here, a constructive interference (Bragg reflection) of a partial reflection which occurs at the interface of the materials 321 and 322 can be used. The reflectivity of the multilayer reflection layer 320 is proportional to the square of the difference between the refractive indexes (real parts of complex refractive indexes) of the two materials 321 and 322 which are alternately stacked. In addition, the wavelength and maximum reflectivity of the light, for example, an extreme ultraviolet (UV) are determined based upon the kinds of the materials 321 and 322. For example, if the multilayer reflection layer 320 has a structure in which molybdenum (Mo) 321 and silicon (Si) 322 are alternately stacked, its maximum reflectivity ranges from approximately 60% to approximately 75%. A capping layer 330 serving to protect the multilayer reflection layer 320 is disposed over the multilayer reflection layer 320. As one example, the capping layer 330 may include a silicon oxide ($SiO_2$) layer or a silicon (Si) layer.

A self-assembled monolayer 340 and an absorption layer 350 are sequentially disposed over the capping layer 330. The self-assembled monolayer may serve to improve adhesion and reduce a damage of the capping layer 330 when the absorption layer 350 is patterned. The self-assembled monolayer 340 may include a silane-based material having at least one carbon-silicon bond structure, as exemplarily shown in the chemical formula 1 above.

Figure 8:
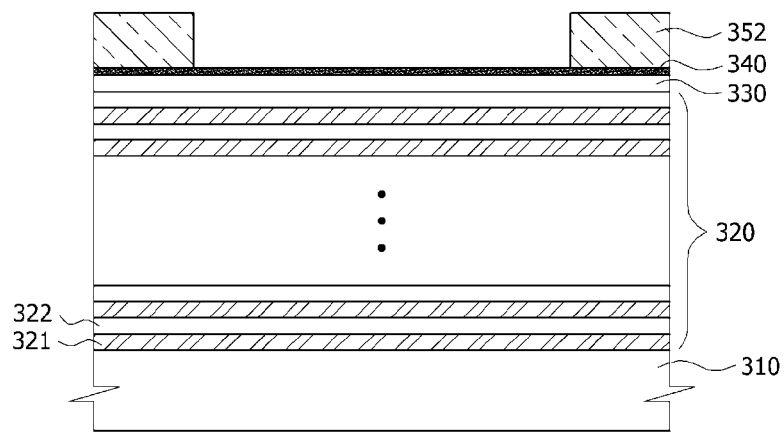
FIGS. 8 to 10 are cross-sectional views explaining a method of fabricating a mask using the blank mask of FIG. 7.
Figure 9:
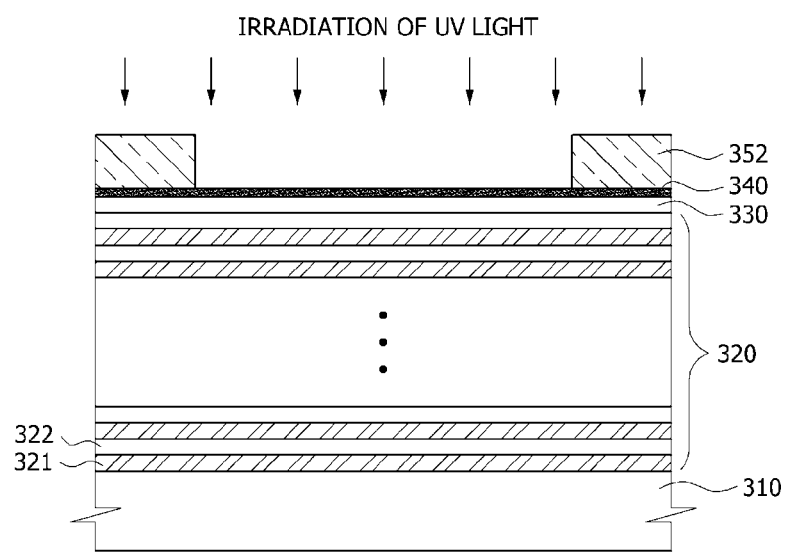
Figure 10:
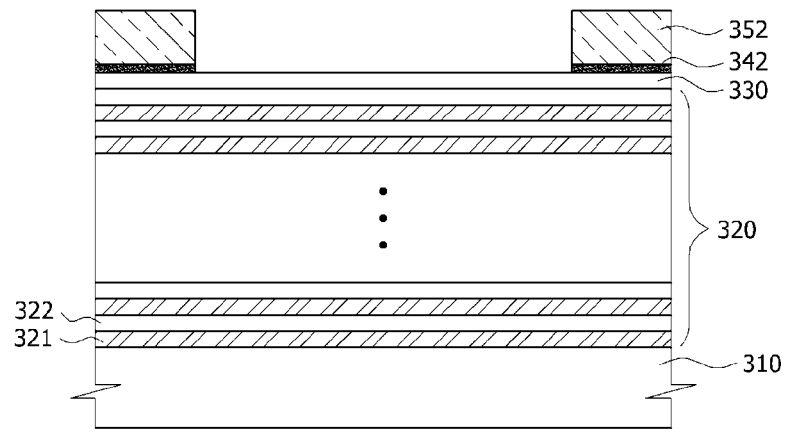

FIGS. 8 to 10 are cross-sectional views explaining a method of fabricating an mask using the blank mask of FIG. 7. As illustrated in FIG. 8, an absorption pattern 352 partially exposing the surface of the self-assembled monolayer 340 is formed by patterning the absorption layer 350. The self-assembled monolayer 340 serves as an etching stop layer during the process of patterning the absorption layer 350. Accordingly, the capping layer 330 disposed under the self-assembled monolayer 340 may not be practically affected by the etching. As illustrated in FIG. 9, a process of patterning the self-assembled monolayer 340 is performed in order to form a self-assembled monolayer pattern. Here, the patterning of the self-assembled monolayer 340 may be performed by irradiation of UV light, for example, extreme ultraviolet (EUV). The self-assembled monolayer 340 onto which the light is irradiated is, for example, removed. Accordingly, a self-assembled monolayer pattern 342 partially exposing the surface of the capping layer 330 is formed. Consequently, as illustrated in FIG. 10, the mask having a structure in which the self-assembled monolayer pattern 342 and the absorption pattern 352 are sequentially stacked over the capping layer 330 is fabricated.

According to the exemplary embodiment of the present invention, since the self-assembled monolayer serving as an etching stop layer is disposed between the capping layer and the buffer layer, a probability of damage of the capping layer may decrease. Moreover, according to another exemplary embodiment of the present invention, the patterning may be performed by irradiating UV light onto the self-assembled monolayer, without using etching gas, during the etching process for patterning the buffer layer. Hence, a probability of damage of the capping layer may decrease.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A blank mask comprising:
    a substrate;
    a multilayer reflection layer disposed over the substrate;
    a capping layer disposed over the multilayer reflection layer;
    a self-assembled monolayer disposed over the capping layer;
    a buffer layer disposed over the self-assembled monolayer; and
    an absorption layer disposed over the buffer layer.

2. The blank mask of claim 1, wherein the capping layer and the buffer layer each comprises a silicon-based material.

3. The blank mask of claim 1, wherein the self-assembled monolayer serves as an etching stop layer with respect to an etching gas used during an etching process for patterning the buffer layer.

4. The blank mask of claim 3, wherein the self-assembled monolayer comprises a silane-based material having at least one carbon-silicon bond structure.

5. The blank mask of claim 1, wherein the multilayer reflection layer includes Mo/Si layers, and the absorption layer includes a tantalum nitride layer or a chromium nitride layer.

6. A blank mask comprising:
    a substrate;
    a multilayer reflection layer disposed over the substrate;
    a capping layer disposed over the multilayer reflection layer;
    a buffer layer disposed over the capping layer and composed of a self-assembled monolayer; and
    an absorption layer disposed over the self-assembled monolayer.

7. The blank mask of claim 6, wherein the self-assembled monolayer serves as a buffer layer.

8. The blank mask of claim 6, wherein the self-assembled monolayer comprises a silane-based material having at least one carbon-silicon bond structure.

9. A method of fabricating a mask, the method comprising:
    preparing a blank mask comprising a substrate, a multilayer reflection layer disposed over the substrate, a capping layer disposed over the multilayer reflection layer, a self-assembled monolayer disposed over the capping layer, a buffer layer disposed over the self-assembled monolayer, and an absorption layer disposed over the buffer layer;
    forming an absorption pattern and a buffer pattern by etching the absorption layer and the buffer layer using the self-assembled monolayer as an etching stop layer; and
    removing the self-assembled monolayer exposed by the absorption pattern and the buffer pattern.

10. The method of claim 9, wherein the removing of the self-assembled monolayer is performed by irradiating ultraviolet light onto an exposed portion of the self-assembled monolayer.

11. A method of fabricating a mask, the method comprising:
    preparing a blank mask comprising a substrate, a multilayer reflection layer disposed over the substrate, a capping layer disposed over the multilayer reflection layer, a buffer layer disposed over the capping layer and composed of a self-assembled monolayer, and an absorption layer disposed over the self-assembled monolayer;
    partially exposing a surface of the buffer layer by etching a portion of the absorption layer; and
    removing an exposed portion of the buffer layer by irradiating ultraviolet light onto the exposed portion of the buffer layer.

12. The method of claim 11, wherein the self-assembled monolayer comprises a silane-based material having at least one carbon-silicon bond structure.

* * * * *